United States Patent
Aldefeld

(10) Patent No.: US 6,229,309 B1
(45) Date of Patent: May 8, 2001

(54) MR METHOD

(75) Inventor: Bernd Aldefeld, Hamburg (DE)

(73) Assignee: U.S. Philips Corporation, New York, NY (US)

( * ) Notice: Subject to any disclaimer, the term of this patent is extended or adjusted under 35 U.S.C. 154(b) by 0 days.

(21) Appl. No.: 09/333,635

(22) Filed: Jun. 15, 1999

(30) Foreign Application Priority Data

Jun. 17, 1998 (DE) .............................. 198 26 864

(51) Int. Cl.$^7$ .............................. G01R 33/20; G01V 3/00
(52) U.S. Cl. .................... 324/314; 324/309; 324/307
(58) Field of Search .................... 324/309, 307, 324/312, 314, 318, 322

(56) References Cited

U.S. PATENT DOCUMENTS

| | | | | |
|---|---|---|---|---|
| 4,794,337 | * | 12/1988 | Twieg | 324/309 |
| 5,034,692 | * | 7/1991 | Laub et al. | 324/309 |
| 5,929,638 | * | 7/1999 | Aldefeld et al. | 324/307 |
| 6,043,656 | * | 3/2000 | Ma et al. | 324/309 |
| 6,087,831 | * | 7/2000 | Bornert et al. | 324/307 |

FOREIGN PATENT DOCUMENTS

| | | | | |
|---|---|---|---|---|
| 4004185 | 11/1990 | (DE) | .............................. | G01R/33/54 |
| WO9802757 | 1/1998 | (WO) | .............................. | G01R/33/38 |

OTHER PUBLICATIONS

"Phase Errors in NMR Images" by D.G. Norris (Univeristy of Aberdeen), in SMRM 1985, pp. 1037–1038.

\* cited by examiner

Primary Examiner—Christine Oda
Assistant Examiner—Tiffany A. Fetzner
(74) Attorney, Agent, or Firm—John F. Vodopia

(57) ABSTRACT

The invention relates to an MR method in which the deterioration of the image quality by the concomitant gradients is reduced or eliminated by imposing a temporal variation on the magnetic fields acting in the examination zone during the time interval between the excitation of the nuclear magnetization and the reception of the MR signal such that the spatial distribution of the phase error upon reception of the MR signal is at least approximately the same for all sequences.

7 Claims, 2 Drawing Sheets

MR METHOD

BACKGROUND OF THE INVENTION

1. Field of the Invention

The invention relates to an MR method with a sequence which is repeated several times and during which the nuclear magnetization in an examination zone is excited in the presence of a uniform, steady magnetic field 2, after which an MR signal is received from the examination zone and phase errors occur due to concomitant gradients in the time interval between the excitation of the nuclear magnetization and the reception of the MR signal. The invention also relates to a device for carrying out the method.

2. Description of the Invention

From WO 98 02 757 it is known that MR methods involve so-called concomitant gradients; concomitant gradients are to be understood to mean the gradients of the magnetic fields which extend perpendicularly to the direction of the steady magnetic field. As a consequence of Maxwell's field equations they inevitably occur together with the desired gradients of the magnetic field components extending in the direction of the steady field. Such concomitant gradients may cause image artifacts when slices are examined whose planes do not extend perpendicularly to the direction of the uniform, steady magnetic field (coronal, sagittal, or oblique slices) or when the slices are situated outside the iso-center of an MRI apparatus.

The influence exerted on the image quality by the concomitant gradients is dependent on their magnitude in relation to the steady magnetic field. In the case of strong steady magnetic fields (0.5 Tesla or more), the effect of the concomitant gradients on the image quality generally will hardly be noticeable. However, in the case of lower strengths of the steady magnetic field, for example 15 mT as occurring in the so-called Overhauser imaging methods, their negative effect on the image quality is very pronounced.

In order to compensate the phase errors caused by the concomitant gradients and affecting the image quality, the known MR apparatus utilizes five additional coils whereby correction magnetic fields are generated. These additional coils are controlled by means of pulses which must be adapted to the relevant MR pulse sequence. This solution requires a comparatively large amount of additional means.

Another solution, which is known from Proc. SMRM, London 1985, 1037–103 8, proposes to split the prephasing pulse for the read-out gradients and the phase encoding pulse into two parts wherebetween a 180° RF pulse acts on the examination zone. The phase errors are then zero at the instant at which the read-out gradient is started. It is a drawback of this method that it is necessary to use a 180° RF pulse in each sequence.

SUMMARY OF THE INVENTION

It is an object of the present invention to reduce the effect of the concomitant gradients on the image quality while using few additional means and without using additional 180° RF pulses. In a method of the kind set forth this object is achieved in that the temporal variation of the magnetic fields acting in the examination zone during the time interval between the excitation of the nuclear magnetization and the reception of the MR signals is such that the spatial distribution of the phase error upon reception of the MR signal is at least substantially the same for all sequences (in this context and hereinafter a sequence is to be understood to mean the single excitation of the nuclear magnetization and the subsequent reception of an MR signal).

The invention is based on the consideration that the MR image formed from the MR signals exhibits blurring when the strength of the magnetic field, and hence the phase error, in the examination zone varies from one sequence to another in the time interval between the excitation of the nuclear magnetization and the reception of the MR signals in the individual sequences, said variation being due to the spatial encoding required for imaging. When a temporal variation is imposed on the overall magnetic field acting on the examination zone during the time interval such that the distribution of the phase error is at least approximately equally large for all sequences, the MR image reconstructed from the MR signals then received will no longer contain blurring.

It is true that the phase error can again vary in time due to the concomitant gradients acting subsequent to said time interval, i.e. during the reception of the MR signal, but this variation is the same for all MR signals. This causes merely distortions in the MR image. Whereas the blurring cannot be eliminated at a later stage (i.e. during or after the reconstruction), if necessary the distortion of the MR image can be corrected at a later stage.

A preferred version concerns an approach which can be simply implemented in practice. Preferred versions of this approach are characterized by a bipolar pulse of the gradient magnetic field. Use is made of the fact that the phase encoding is linearly dependent on the time integral over the phase encoding gradients, whereas the phase error is dependent on the time integral of the square of the gradient. The temporal variation of the gradient can thus be configured in such a way that on the one hand the necessary phase encoding is achieved and on the other hand the phase error that is time integral of the square of the gradient, is equally large for all sequences.

A bipolar pulse of this gradient as used in the preferred versions, is to be understood to mean a gradient whose polarity changes from a positive to a negative value (during the time interval). Bipolar pulses of gradients are known per se, for example from DE-PS 40 04 185. According to the known method, however, the bipolar gradient pulses are used for flux compensation. The disturbing effects of the concomitant gradients cannot be corrected by means of the known pulse sequence, inter alia because they have the same temporal variation in all sequences.

In a more preferred embodiment, magnetic field gradients are applied in a phase encoding direction in the time between exciting nuclear magnetization and receiving generated MR signals, wherein the applied gradient comprises an additional bipolar pulse of the gradient magnetic field generated before and/or after a phase-encoding gradient pulse, the time integral over the bipolar pulse being zero, and the time integral over the square of the sum of the phase-encoding gradient pulse and the bipolar pulse being the same for all sequences.

In another more preferred embodiment, magnetic field gradient are similarly applied in phase encoding direction in the time between exciting nuclear magnetization and receiving generated MR signals, wherein the applied gradient is a single bipolar pulse which is modified from one sequence to another and, which has a temporal variation chosen to be such that the time integral over the bipolar pulse of the gradient magnetic field corresponds to the phase encoding required for the relevant sequence, and the time integral over the square of the bipolar pulse of the gradient magnetic field is equally large for all sequences.

It is advantageous if the phase encoding gradient and the readout gradient do not overlap during the time interval.

This invention also is directed to an MR apparatus including a main field magnet, gradient coil system, an RF coil system, a receiver, and a control unit for controlling these elements to perform the methods according to the invention.

BRIEF DESCRIPTION OF THE DRAWINGS

The invention will be described in detail hereinafter with reference to the drawings. Therein.

DERAILED DESCRIPTION OF THE PREFERRED EMBODIMENT

Figure 1:
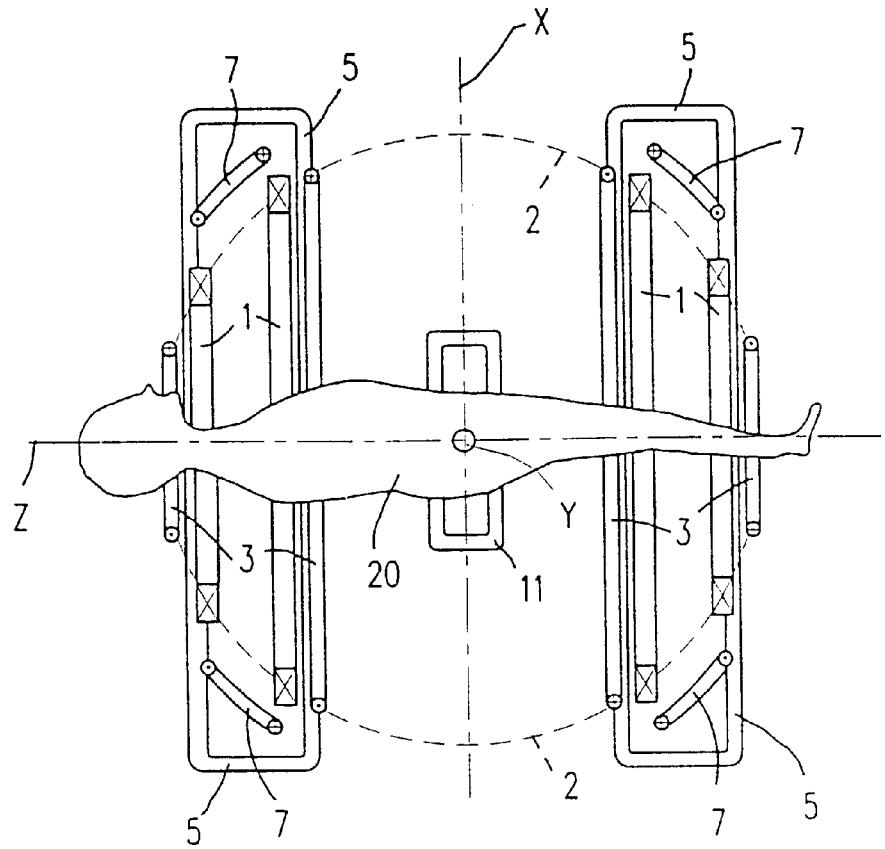
FIG. 1 shows an MR apparatus which is suitable for carrying out the invention.

The MR apparatus which is diagrammatically shown in FIG. 1 includes a main field magnet 1 which consists of, for example four coils and generates a uniform, steady magnetic field which extends in the z direction and whose strength is adjustable, if desired. The patient 20 to be examined is arranged within the main field magnet 1.

Four coils 3 are provided in order to generate a magnetic field which extends in the z direction and varies linearly in this direction and has a gradient $G_z$. Also provided are four coils 7 which generate a magnetic field which also extends in the z direction and has a gradient $G_x$ which varies linearly in the x direction (i.e. vertically in FIG. 1). A magnetic field which extends in the z direction, has a gradient $G_y$ and varies linearly in the y direction (perpendicularly to the plane of drawing of FIG. 1) is generated by the four coils 5 whose construction may be identical to that of the coils 7. They are arranged so as to be 90° offset with respect thereto and only two of these coils are shown. (Herein, the magnetic fields produced by the gradient coils are also referred to as "gradients" for the sake of simplicity or, in conformity with their function, as read-out gradient, phase encoding gradient, or slice selection gradient). Because each of the three coil systems 3, 5 and 7 is arranged so as to be symmetrical with respect to an iso-center, the magnetic induction at the iso-center is determined exclusively by the steady, uniform magnetic field of the main field magnet 1.

Figure 2:
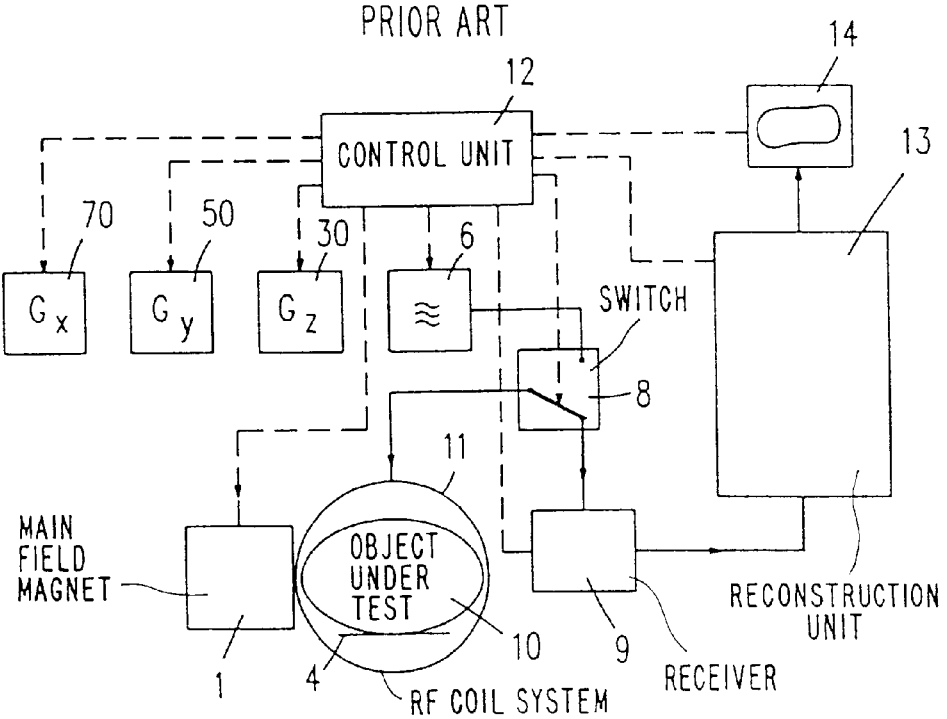
FIG. 2 shows the block diagram of such an MR apparatus.

There is also provided an RF coil system 11 which generates an essentially uniform RF magnetic field which extends perpendicularly to the direction of the steady magnetic field (i.e. perpendicularly to the z direction). As is shown in FIG. 2, via a switch 8 the RF coil system 11 can be optionally connected to a transmitter 6 or to a receiver 9. In the switch position shown in the Figure, the RF coil system can be used for the reception of the MR signals generated in the examination zone. An object under test 10 is shown on table 4 surrounded by coil system 11. However, for the reception of the MR signals preferably one (or more) separate RF receiver coils (not shown in FIG. 1) are used. The MR signals are detected in a phase-sensitive manner and digitized in the receiver 9.

The position in time of the RF pulses, their bandwidth and their central frequency can be controlled by a control unit 12 which acts on the transmitter 6. The currents of the gradient coils 3, 5 and 7 are supplied by the units 30, 50 and 70 which themselves are controlled by the control unit 12 so that the temporal variation of the gradients is also determined by the control unit. There is also provided a reconstruction unit 13 which processes the digitized MR signals, transposed to the low-frequency range and, possibly after a distortion elimination procedure, reconstructs an MR image therefrom which can be displayed on a monitor 14.

Customary MR methods are based on the assumption that the absolute value of the magnetic flux density is determined essentially by the z component $B_z$ of the magnetic field. This z component is calculated in known manner in conformity with the formule:

$$B_z = B_0 + xG_x + yG_y + zG_z \quad (1)$$

Therein, $B_0$ is the magnetic flux density of the steady magnetic field, x, y, z are the location co-ordinates and $G_x$, $G_y$, $G_z$ are the gradients of the magnetic field in the x, the y and the z direction, respectively. However, the concomitant gradients, also causing a component $B_x$, $B_y$ in the x direction and the y direction, respectively, are then ignored. Therefore, the exact amplitude of the magnetic flux density B is calculated as:

$$B = \sqrt{B_x^2 + B_y^2 + B_z^2} \quad (2)$$

The components $B_x$, $B_y$ of the magnetic field in the x direction and the y direction, respectively, are calculated as $$B_x = zG_x - \frac{x}{2}G_z \quad (3)$$

and $$B_y = zG_y - \frac{y}{2}G_z$$

According to the customary MR methods, taking into account only the equation (1), therefore, the precession of the nuclear spins is not determined exactly. Thus, a time-dependent and location-dependent error $\Delta\Phi$ occurs in the calculation of the phase angle of the precessing nuclear spins, being:

$$\Delta\Phi(x, y, z, t) =$$

$$\gamma \int_0^t \left[ \sqrt{B_x^2(x, y, z, t') + B_y^2(x, y, z, t') + B_z^2(x, y, z, t')} - B_z(x, y, z, t') \right] dt'$$

Therein, $\gamma$ is the gyromagnetic constant (approximately 42.5 MHz/T). The components $B_x(x,y,z,t')$ . . . $B_z(x,y,z,t')$ are given by the equations 1 and 3. This expression can be developed into a Taylor series. The principal term of the development, i.e. the first-order phase error, can be derived therefrom as follows:

$$\Delta\Phi_1(x, y, z, t) = g(x, y, z) \int_0^t G^2(t') dt' \quad (5)$$

Therein, g(x,y,z) is a function of the location x, y, z. G denotes a gradient formed by the components $G_x$, $G_y$ and $G_z$, for example the phase encoding gradient. The function g(x,y,z) is proportional to $1/B_0$.

Because of the phase errors, the quality of the reconstructed MR images is affected in dependence on the MR method used; this may become manifest as artifacts, distortions and blurring. In the field of conventional MR, i.e. in the range of medium and high steady magnetic field strengths, the negative effect of these phase errors becomes manifest only for some MR methods which are susceptible in this respect (for example, EPI or helical MRI). In the case of very low steady field strengths, notably in the case of the so-called Overhauser imaging, standard methods are also affected. The time-dependent or sequence-dependent variation of the phase error and the resultant blurring of the MR image are avoided by modifying the MR sequence, which may be known per se, in such a manner that $\Delta\Phi_1(x,y,z,t)$ becomes equally large for all sequences.

Figure 3:
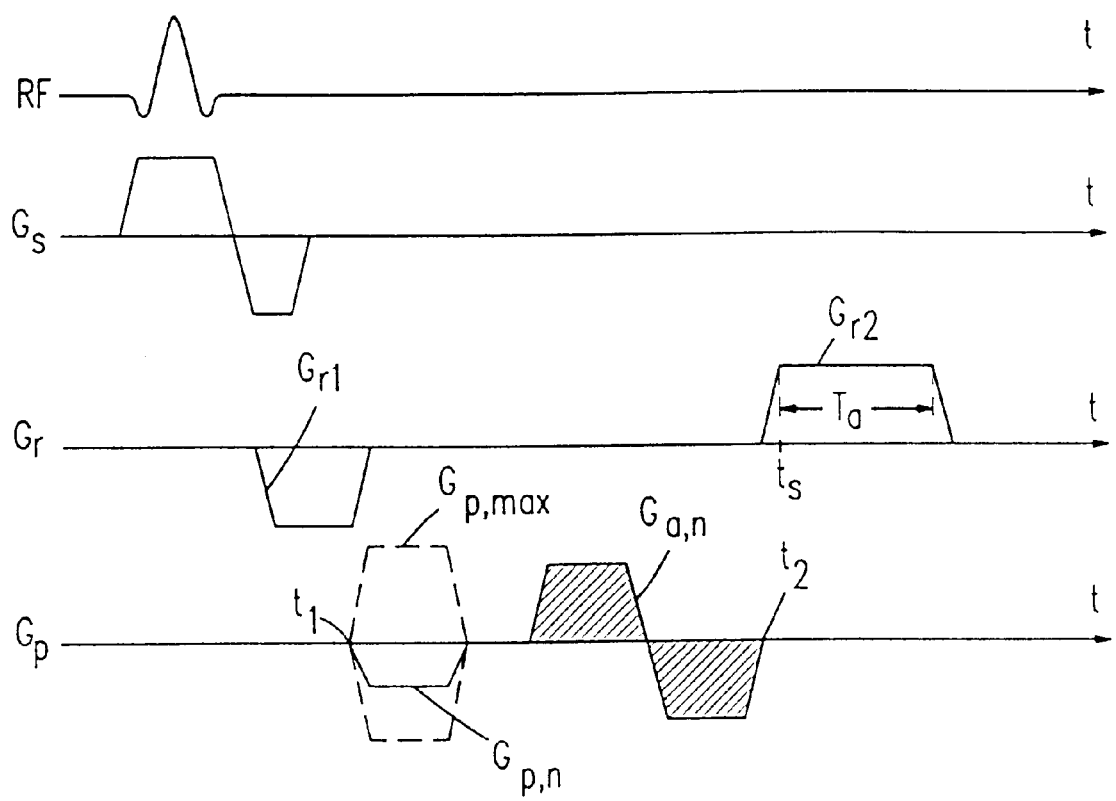
FIG. 3 shows the temporal variation of various signals in a first sequence.

FIG. 3 shows the modification according to the invention for a sequence of the type 2DFT in which the so-called k-space is scanned in lines (during each sequence or during each phase encoding step one line of the k-space is scanned). The first and the second line show the temporal variation of the RF pulse RF and of the slice selection gradient $G_s$. Because of the temporal position of RF and $G_s$ shown, the nuclear magnetization is excited in a slice extending perpendicularly to the direction of the slice selection gradient $G_s$. The third line shows the temporal variation of the read-out gradient $G_r$. As seen in FIG. 3, at time $t_s$, the actual read-out gradient causes data to be read out, which read out occurs for the entire period $T_a$. The actual read-out gradient $G_{r2}$ is preceded by a prephasing gradient $G_{r1}$. $G_{r1}$ and $G_{r2}$ have mutually opposed polarities and the time integral over $G_{r1}$ generally amounts to half the time integral over $G_{r2}$.

During the time interval $t_{1-t2}$ between the end of $G_{r1}$ and the beginning of $G_{r2}$, first a phase encoding gradient $G_{p,n}$ is generated in known manner (the index n means that the $n^{th}$ sequence is concerned); the amplitude or time integral thereof is varied from one sequence to another, the maximum positive or negative phase encoding gradient $G_{p,max}$ being denoted by dashed lines. Subsequently, according to the invention there is generated a bipolar gradient pulse $G_{a,n}$ which has the same direction as the phase encoding gradient and terminating at the instant $t_2$ (or sooner). The bipolar pulse has successively a positive and a negative polarity (or vice versa) and is proportioned in such a manner that the time integral over $G_{a,n}$ is zero. Thus, $G_{a,n}$ has no effect whatsoever on the phase encoding.

The phase error $\Delta\Phi_1$ produced by the gradients $G_{p,n}$ and $G_{a,n}$ which are varied from one sequence to another, is calculated, for the variation shown in FIG. 3, in conformity with the equation 5 as $$\Delta\Phi_1(x, y, z, t) = g(x, y, z)\int_0^t [G_{p,n}^2(t') + G_{a,n}^2(t')]dt' \qquad (6)$$

The amplitudes of $G_{p,n}$ and $G_{a,n}$ are then chosen, for example to be such that the equation $$G_{a,n} = \sqrt{\frac{1}{2}(G_{p,max}^2 - G_{p,n}^2)} \qquad (7)$$

is satisfied (in this case $G_{p,n}$ and $G_{a,n}$ denote the amplitudes). The equation 7 means that, for example in one sequence, in which $G_{p,n}$ reaches the maximum value $G_{p,max}$, the amplitude of $G_{a,n}$ has the value zero, whereas it assumes its maximum value (approximately 0.7 $G_{p,max}$) for $G_{p,n}=0$.

Insertion of the equation 7 in the equation 6 yields for the first-order phase error:

$$\Delta\Phi_1(x, y, z, t) = g(x, y, z, t)\int_0^t G_{p,max}^2(t')dt' \qquad (8)$$

Thus, the phase error $\Delta\Phi_1$ is the same for all phase encoding steps (or all sequences) at the instant $t_2$ (but a function of the location). If $G_p$ and $G_r$ do not overlap, as is advantageous, the overall phase error at the instant $t_2$, i.e. when the sampling of the MR signal (by $G_{r2}$) commences, becomes the same for all phase encoding steps. The phase errors accumulated until the instant of data sampling in this case cause only a phase modulation of the reconstructed MR image; this can be calculated and simply corrected by way of multiplication. The residual phase errors, arising during the sampling by the read-out gradient $G_r$, give rise to a spatial image distortion which can be eliminated by way of suitable methods.

Figure 4:
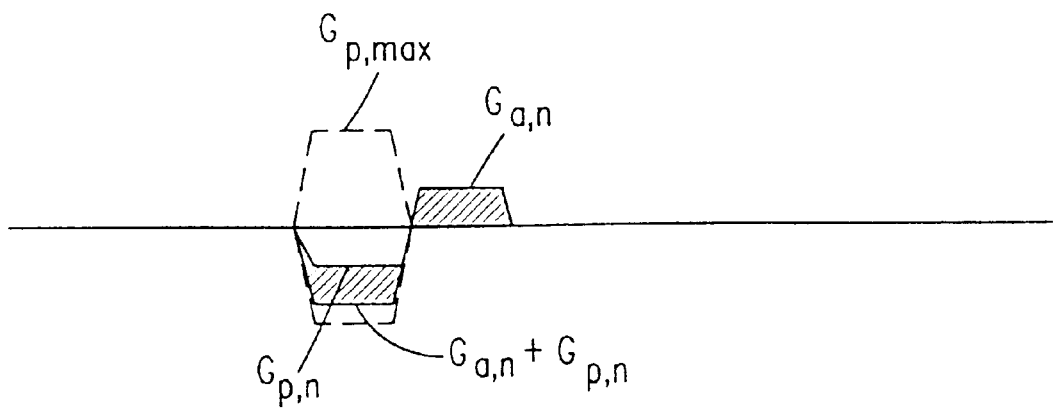
FIG. 4 shows a modification of this sequence.

The shape of the bipolar pulse, its duration and its starting instant can be changed from one phase encoding step to the next. The two parts of the bipolar pulse may have a different shape, pulse duration and starting time. The bipolar pulse can be generated, as shown in FIG. 3, after the phase encoding pulse, but also before that pulse. The positive and the negative part of the bipolar pulse $G_{a,n}$ can also be generated separately from one another, i.e. one part before and the other part after the phase encoding pulse. However, it is alternatively possible for the phase encoding pulse and the bipolar pulse to overlap as shown in FIG. 4. In that case the amplitude of the bipolar gradient can be chosen as $$G_{a,n} = -\frac{1}{2}G_{p,n} \pm \sqrt{\frac{1}{2}(G_{p,max}^2 - G_{p,n}^2)} \qquad (9)$$

the positive root then has to be used for positive values of $G_{p,n}$ and vice versa. In this case the equation (8) again holds for the first-order phase errors.

After the customary reconstruction of the MR image from the MR signals received, the distortions in the MR image are eliminated as follows:

1. The phase error $\Delta\Phi(u,v)$, accumulated during the data sampling time $T_a$ (see FIG. 3), is calculated for each pixel u, v (u, v may be identical to the directions r, p of the gradients $G_r$ and $G_p$).

2. A function f is calculated from the phase error as $$f(u,v)=\Delta\Phi(u,v)d/2\pi \qquad (10)$$

where d represents the linear dimension of a pixel. Subsequently, the function f is differentiated as a function of the space co-ordinate u (df/du).

3. The corrected MR image I(u,v) is then derived for each pixel from the non-corrected MR image $I_0(u,v)$ in conformity with the formule:

$$I(u,v)=I_0(u+f,v)(1+df/du)e^{jf\pi/d}(j=(-1)^{1/2}) \qquad (11)$$

The method according to the invention can be used for various MR sequences. The embodiments above concern the combination with a gradient echo sequence. Similarly, a combination with a spin echo sequence is feasible. The method can also be used in a segmented EPI sequence in order to compensate a part of the phase errors, that is to say the phase errors which are caused by the different prephasing pulses.

When the directions of $G_p$ and $G_r$ are situated in the x-y plane, the variation of the phase encoding gradient can also be compensated by making the bipolar gradient extend in the direction of the read-out gradient. Thus, it is not necessary to modify the phase encoding gradient by way of a bipolar gradient pulse as explained with reference to the FIGS. 3 and 4. The other gradients $G_r$, $G_s$ can also be modified from one sequence to another. It is essential only that for all sequences the phase error is equally large for each voxel (however, the phase error may be different for different voxels).

All references cited herein are incorporated herein by reference in their entirety and for all purposes to the same extent as if each individual publication or patent or patent application was specifically and individually indicated to be incorporated by reference in its entirety for all purposes.

What is claimed is:

1. An MR method comprising a sequence which is repeated several times, the sequence including:
   exciting nuclear magnetization in an examination zone in the presence of a uniform, steady magnetic field, and
   receiving from the examination zone MR signals, wherein phase errors occur in the received MR signals due to concomitant gradients in the time interval between exciting the nuclear magnetization and receiving the MR signal,
   wherein the temporal variation of the magnetic fields acting in the examination zone during the time interval between exciting the nuclear magnetization and receiving the MR signals is such that the spatial distribution of the phase errors in the received MR signals is approximately the same for all sequences.

2. An MR method as claimed in claim 1 further comprising removing distortions in an MR image reconstructed from the MR signals received during the various sequences.

3. An MR method as claimed in claim 1 further comprising a step of applying a gradient in a phase encoding direction between the steps of exciting and receiving, wherein the applied gradient has a time integral which is modified from one sequence to another, and wherein the temporal variation of the applied gradient is such that the time integral over the square of the applied gradient magnetic field is approximately equally large for all sequences.

4. An MR method as claimed in claim 3 wherein the applied gradient comprises an additional bipolar pulse ($G_a$) of the gradient magnetic field generated before and/or after a phase-encoding gradient pulse, the time integral over the bipolar pulse being zero, and the time integral over the square of the sum of the phase-encoding gradient pulse and the bipolar pulse being the same for all sequences.

5. An MR method as claimed in claim 3 wherein the applied gradient is a bipolar pulse which is modified from one sequence to another and, which has a temporal variation chosen to be such that
   the time integral over the bipolar pulse of the gradient magnetic field corresponds to the phase encoding required for the relevant sequence, and
   the time integral over the square of the bipolar pulse of the gradient magnetic field is equally large for all sequences.

6. An MR method as claimed in claim 1 wherein gradients applied in a phase encoding direction and in a read-out direction do not overlap in time.

7. An MR apparatus comprising:
   a main field magnet for generating a uniform, steady magnetic field,
   gradient coil systems for generating magnetic gradient fields having gradients extending in different directions,
   an RF coil system for exciting nuclear magnetization in a slice of an examination zone by means of at least one RF pulse (RF),
   a receiver for receiving the MR signals generated in the examination zone, and
   a control unit for controlling the currents through the gradient coil systems and the RF coil system, wherein the control unit is programmed to perform according to the method of claim 1 so that the temporal variation of the gradient magnetic fields acting in the examination zone during the time interval between excitation of nuclear magnetization by an RF pulse and reception of MR signals by the receiver is such that the spatial distribution of the phase errors in received MR signals due to concomitant gradients is approximately the same for all sequences.

* * * * *